United States Patent
Buck et al.

(10) Patent No.: US 9,914,636 B2
(45) Date of Patent: Mar. 13, 2018

(54) MEMS COMPONENT INCLUDING A SOUND-PRESSURE-SENSITIVE DIAPHRAGM ELEMENT

(71) Applicant: Robert Bosch GmbH, Stuttgart (DE)

(72) Inventors: Thomas Buck, Gerlingen-Schillerhoehe (DE); Fabian Purkl, Gerlingen (DE); Michael Stumber, Korntal-Muenchingen (DE); Rolf Scheben, Reutlingen (DE); Benedikt Stein, Stuttgart (DE); Christoph Schelling, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/212,334

(22) Filed: Jul. 18, 2016

(65) Prior Publication Data
US 2017/0022046 A1    Jan. 26, 2017

(30) Foreign Application Priority Data

Jul. 22, 2015 (DE) .................. 10 2015 213 771

(51) Int. Cl.
*B81B 3/00* (2006.01)
*H04R 17/02* (2006.01)

(52) U.S. Cl.
CPC .......... *B81B 3/0072* (2013.01); *H04R 17/02* (2013.01); *B81B 2201/0257* (2013.01); *B81B 2203/0127* (2013.01); *B81B 2207/015* (2013.01); *B81B 2207/07* (2013.01); *H04R 2201/003* (2013.01)

(58) Field of Classification Search
CPC .............. H04R 17/02; H04R 2201/003; B81B 3/0072; B81B 2201/0257; B81B 2207/07; B81B 2203/0127; B81B 2207/015
USPC ......................................................... 257/416
See application file for complete search history.

(56) References Cited

U.S. PATENT DOCUMENTS

| | | | |
|---|---|---|---|
| 9,029,963 B2 | 5/2015 | Sparks et al. | |
| 2006/0284516 A1* | 12/2006 | Shimaoka | H04R 19/04 310/322 |
| 2008/0123876 A1* | 5/2008 | Sato | H04R 19/016 381/174 |
| 2009/0211838 A1* | 8/2009 | Bilan | A61B 7/04 181/131 |
| 2010/0254560 A1* | 10/2010 | Mehregany | H04R 19/005 381/361 |

(Continued)

FOREIGN PATENT DOCUMENTS

WO    WO 2008/103672 A2    8/2008

*Primary Examiner* — Marc Armand
*Assistant Examiner* — Sue Tang
(74) *Attorney, Agent, or Firm* — Norton Rose Fulbright US LLP; Gerard Messina (57) ABSTRACT

A MEMS microphone component including at least one sound-pressure-sensitive diaphragm element is formed in the layer structure of the MEMS component, which spans an opening in the layer structure. The diaphragm element is attached via at least one column element in the central area of the opening to the layer structure of the component. The deflections of the diaphragm element are detected with the aid of at least one piezosensitive circuit element, which is implemented in the layer structure of the diaphragm element and is situated in the area of the attachment of the diaphragm element to the column element.

9 Claims, 8 Drawing Sheets

(56) References Cited

U.S. PATENT DOCUMENTS

2014/0015070 A1* 1/2014 Zoellin .............. B81B 3/0021
257/416
2014/0084395 A1 3/2014 Sparks et al.

* cited by examiner

MEMS COMPONENT INCLUDING A SOUND-PRESSURE-SENSITIVE DIAPHRAGM ELEMENT

CROSS REFERENCE

The present application claims the benefit under 35 U.S.C. § 119 of German Patent Application No. DE 102015213771.6 filed on Jul. 22, 2015, which is expressly incorporated herein by reference in its entirety.

BACKGROUND INFORMATION

The present invention relates to a MEMS component, in the layer structure of which at least one sound-pressure-sensitive diaphragm element is formed, which spans an opening in the layer structure, the diaphragm element being attached via at least one column element in the central area of the opening to the layer structure of the component.

Such a MEMS microphone component is described in PCT Published Application No. WO 2008/103672 A2. The signal detection takes place here capacitively with the aid of a capacitor arrangement, the electrodes of which are situated, on the one hand, on the movable diaphragm element and, on the other hand, on a fixed counter element of the microphone structure. The microphone structure is implemented in a layer structure on a base substrate, so that the diaphragm element and the counter element are situated one above another and spaced apart from one another. The diaphragm element extends over an opening in the substrate rear side. It is connected only to the counter element, specifically by a centrally situated column element. The outer edge of the diaphragm element is not incorporated into the layer structure, so that intrinsic mechanical stresses in the diaphragm element may dissipate via the free diaphragm edge.

The conventional capacitive MEMS microphone component is distinguished by a very good microphone performance, in particular with regard to the signal-to-noise ratio SNR, but in exchange the power consumption in the case of capacitive signal detection is relatively high and is excessively high for an "always-on" operation.

A MEMS microphone component having a sound-pressure-sensitive diaphragm element is described in U.S. Patent Application Pub. No. 2014/0084395 A1, which spans an opening or cavity in the layer structure and the outer edge of which is circumferentially attached to the layer structure of the component. The deflections of the diaphragm element are detected here with the aid of at least one piezosensitive circuit element, which is situated in the edge area of the diaphragm element, i.e., in the area of the attachment of the diaphragm element to the layer structure.

One advantage of piezosensitive MEMS microphone components in relation to capacitive MEMS microphone components is that they may be equipped very easily with a "wake-up" functionality. They may thus be developed in such a way that they only consume power if needed, i.e., for example, only if a specific sound level is exceeded. The power consumption of piezosensitive MEMS microphones in the "always-on" operating mode is thus significantly less than that of capacitive MEMS microphone components.

However, production-related and/or temperature-related mechanical stresses frequently occur within the diaphragm structure in the case of diaphragm elements incorporated circumferentially into the layer structure, as in the case of the MEMS microphone component described in U.S. Patent Application Pub. No. 2014/0084395 A1, these stresses not being able to dissipate due to the circumferential incorporation. Such intrinsic mechanical stresses have a particularly disadvantageous effect on the performance of piezosensitive MEMS microphones, since they directly influence and corrupt the measuring signal.

SUMMARY

The present invention provides a component embodiment, in which MEMS microphone components having very good microphone performance and comparatively low power consumption may be implemented.

This may be achieved according to the present invention in that the deflections of the diaphragm element, which spans an opening in the layer structure of the component and is attached via at least one column element in the central area to the layer structure, are detected with the aid of at least one piezosensitive circuit element, which is implemented in the layer structure of the diaphragm element and is situated in the area of the attachment of the diaphragm element to the column element.

In accordance with the present invention, a centrally suspended diaphragm structure having a free diaphragm edge is particularly well suitable for piezosensitive signal detection, since intrinsic stress may be largely excluded as an error source. Furthermore, a central suspension of the diaphragm structure in the case of piezosensitive signal detection contributes to amplifying the measuring signal or to increasing the measuring sensitivity. This is because the signal level of the measuring signal is higher the greater the mechanical stresses are at the location of the piezosensitive circuit element. In the case of a central suspension of the diaphragm structure, the mechanical stresses, which occur upon a sound-pressure-related deflection in the diaphragm structure, are concentrated on a relatively small surface area in the surroundings of the central suspension. In contrast thereto, in the case of a circumferential attachment of the diaphragm structure, the mechanical stresses are distributed over the entire diaphragm edge, i.e., a significantly greater surface area, so that the mechanical stresses are significantly weaker here than in the attachment area of a central diaphragm suspension. Accordingly, the measuring signal for a given sound pressure with suitable arrangement of the piezosensitive circuit elements is significantly greater in the case of central diaphragm suspension than in the case of a circumferential edge attachment.

Fundamentally, there are many different options for the implementation of the component according to the present invention, with regard to the layout and material of the diaphragm structure and the implementation of the piezosensitive circuit elements for signal detection and the electrical connection thereof. However, there are also various design options with regard to the delimitation of the diaphragm deflection and the air exchange between the two sides of the diaphragm structure. The application and the usage site of the MEMS component and the requirements for the quality of the measuring signal are always to be taken into consideration.

The diaphragm structure of a MEMS component according to the present invention may thus include only one diaphragm element, which extends on all sides up to the edge of the opening in the layer structure or also beyond this. However, multiple diaphragm elements may also be provided, which together span an opening in the layer structure of the component. These diaphragm elements may be attached via a shared column element to the layer structure, so that they are each connected like a paddle at one end to the column element and extend therefrom up to the edge of the opening in the layer structure or beyond. However, the diaphragm elements may also each be attached via a separate column element to the layer structure and/or may span a separate partial opening.

The column element or elements may be situated centrally or also eccentrically in relation to the diaphragm area. The diaphragm element or elements may cover a round diaphragm area or also a square diaphragm area. They may be implemented in a single material layer of the layer structure or also in multiple layers. The piezosensitive circuit elements may be piezoelectric circuit elements which are implemented, for example, in the form of doped or undoped aluminum nitride AlN, zinc oxide ZnO, or lead-zirconate-titanate PZT. Alternatively or additionally thereto, piezoresistive circuit elements may also be used for the signal detection.

The electrical connection of the piezosensitive circuit elements, which are situated in the area of the attachment of the diaphragm element to the column element, is advantageously carried out with the aid of one or multiple via(s) in the column element, since it represents the only mechanical connection or at least the main connection to the layer structure of the component.

This is because, in one preferred specific embodiment of the present invention, the diaphragm edge is not incorporated. In this case, there is a circumferential gap between the at least one diaphragm element and the edge of the opening in the layer structure.

For many applications, it has proven to be advantageous if an overload protector for the at least one diaphragm element, which interacts with the outer edge of the at least one diaphragm element, is formed in the edge area of the opening. For this purpose, for example, a groove may be formed in the edge area of the opening, into which the outer edge of the diaphragm element protrudes, so that the inner wall of the groove functions as a stop for the diaphragm element. The damping behavior of the diaphragm element may also be intentionally influenced via the dimensions of the groove and the formation of the outer diaphragm edge, so that the cross-sectional area and length of the path, via which the air exchange takes place between the two sides of the diaphragm element, may be varied.

In another specific embodiment of the present invention, the outer edge of the at least one diaphragm element is connected via a spring structure to the upper edge of the opening in the layer structure. This spring structure is to be designed in such a way that it does not obstruct the diaphragm deflections in the case of sound pressures up to a predefined level, but it functions as an overload protector in the case of greater loads. The damping behavior of the diaphragm element may be influenced here via the layout of the spring structure, i.e., via the number, size, and arrangement of passage openings in the spring structure.

BRIEF DESCRIPTION OF THE DRAWINGS

As described above, there are various options for advantageously developing and refining the teaching of the present invention. For this purpose, reference is made, on the one hand, to the subordinated patent claims and, on the other hand, to the description below of multiple exemplary embodiments of the present invention.

DETAILED DESCRIPTION OF EXAMPLE EMBODIMENTS

Figure 1A:
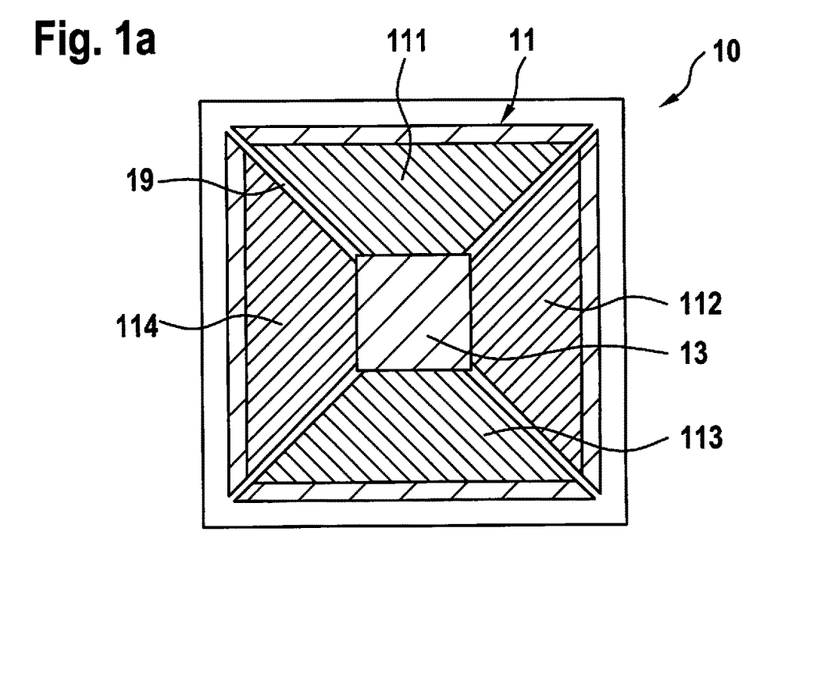
FIG. 1a shows a top view of the upper side of a first MEMS component 10 according to the present invention.
Figure 1B:
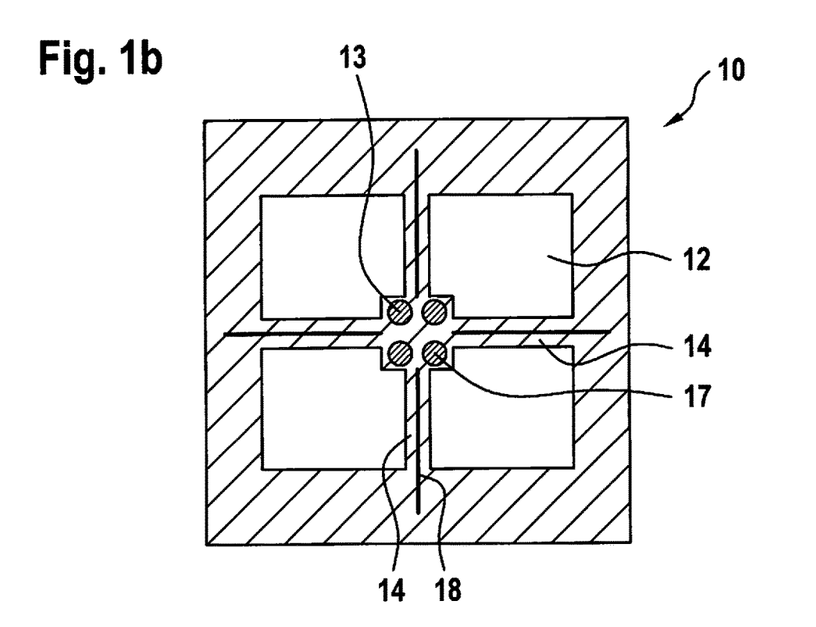
FIG. 1b shows a top view of the lower side of this MEMS component 10.
Figure 1C:
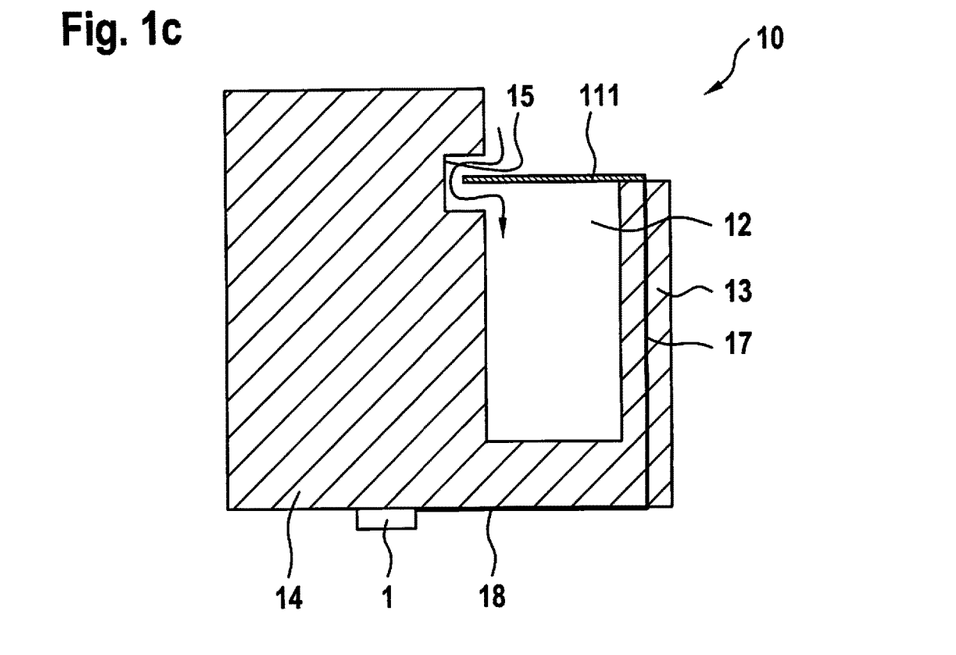
FIG. 1c shows a section through the structure of the MEMS component 10.

FIGS. 1a through 1c show a first exemplary embodiment 10 of a MEMS component according to the present invention. The component structure is implemented in a layer structure on a semiconductor substrate, which is not shown in detail here, however. It includes a sound-pressure-sensitive diaphragm structure 11, which is made here of four trapezoidal diaphragm elements 111, 112, 113, 114. These are dimensioned and situated in such a way that they together span a rectangular or square opening 12 in the layer structure, which is illustrated in particular by FIG. 1a. For this purpose, diaphragm elements 111, 112, 113, 114 are each connected on one side to a column element 13, which is situated in the center of opening 12 and is attached via a bar structure 14 on the component rear side to the layer structure of component 10. The central arrangement of column element 13 and rear bar structure 14 are illustrated by FIG. 1b. Column element 13 has a square cross section. Individual diaphragm elements 111, 112, 113, 114 protrude like paddles from the four sides of column element 13 and each extend up to the opposite edge of opening 12. A circumferential groove 15 is formed in the edge area of opening 12, into which the free ends of diaphragm elements 111, 112, 113, 114 protrude. The wall of the groove forms a stop for diaphragm elements 111, 112, 113, 114 and thus delimits the deflection thereof like an overload protector, which is illustrated in particular by FIG. 1c.

According to the present invention, the deflections of diaphragm elements 111, 112, 113, 114 are each detected with the aid of at least one piezosensitive circuit element. These are implemented in the layer structure of the diaphragm structure and are each situated in the area of the attachment of diaphragm element 111, 112, 113, 114 to column element 13. The piezosensitive circuit elements are not shown in detail here, but the electrical connection thereof is, which is implemented in the form of vias 17 inside column element 13 and strip conductors 18, which are led to terminal pads 1 on the component rear side.

As already mentioned, diaphragm structure 11 is made in exemplary embodiment 10 described here of four paddle-like diaphragm elements 111, 112, 113, 114, which together span an opening 12 in the component rear side. The pressure equalization between the two sides of diaphragm structure 11 takes place, on the one hand, via slots 19 between diaphragm elements 111, 112, 113, 114 and, on the other hand, via circumferential groove 15. The acoustic loss resistance of the microphone structure and therefore the microphone sensitivity may be intentionally influenced via the opening area of slots 19 and groove 15.

Figure 2A:
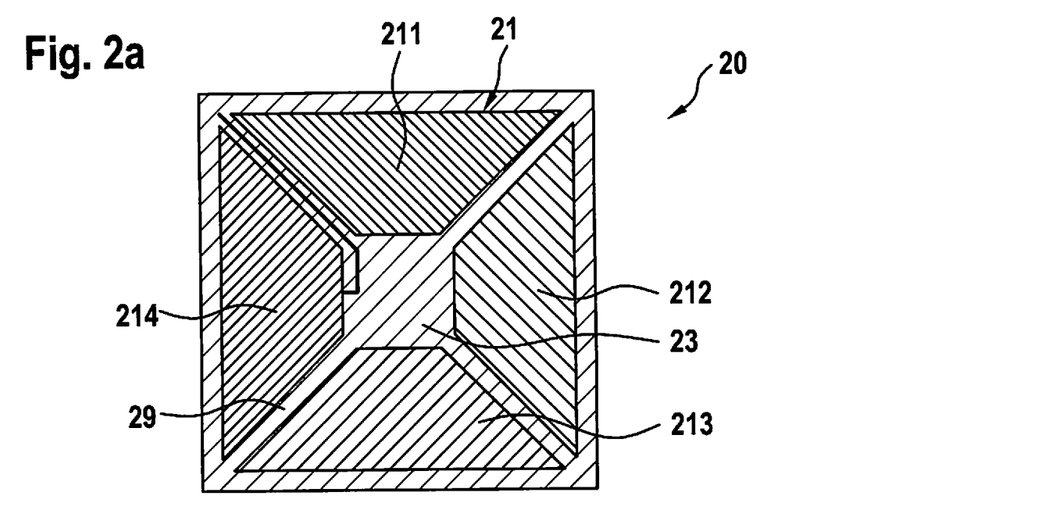
FIG. 2a shows a top view of the upper side of a second MEMS component 20 according to the present invention.
Figure 2B:
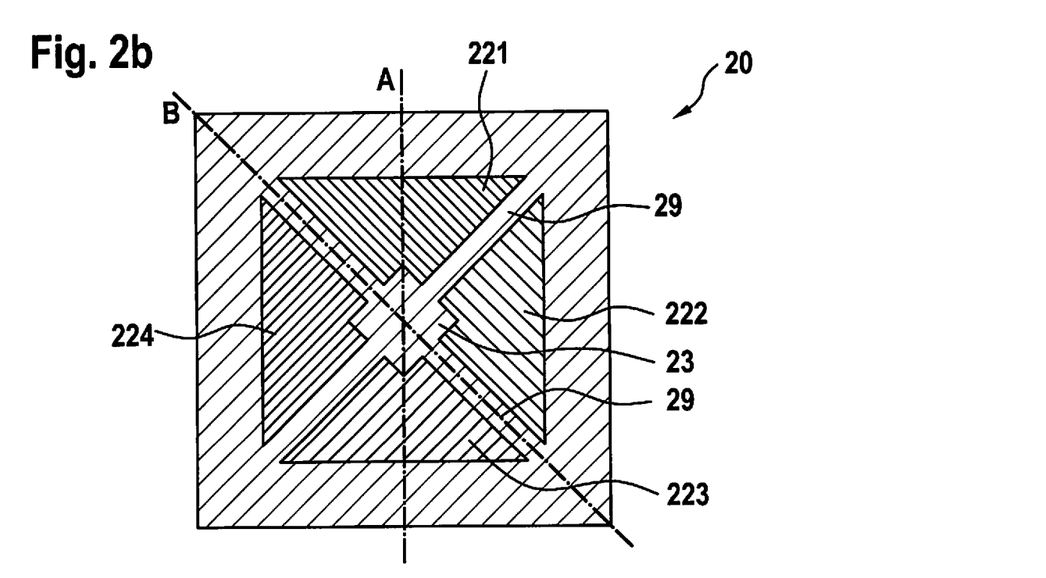
FIG. 2b shows a top view of the lower side of this MEMS component 20.
Figure 2C:
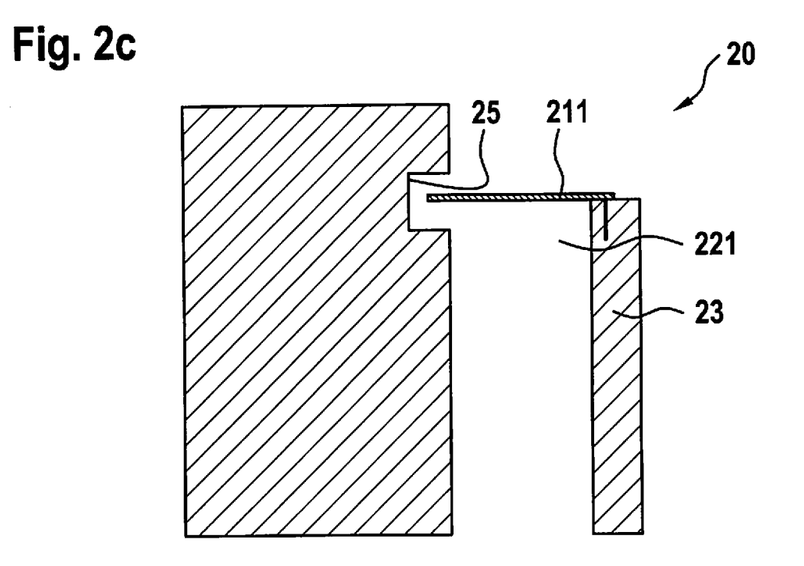
FIG. 2c shows a section through the structure of MEMS component 20 along section plane A.
Figure 2D:
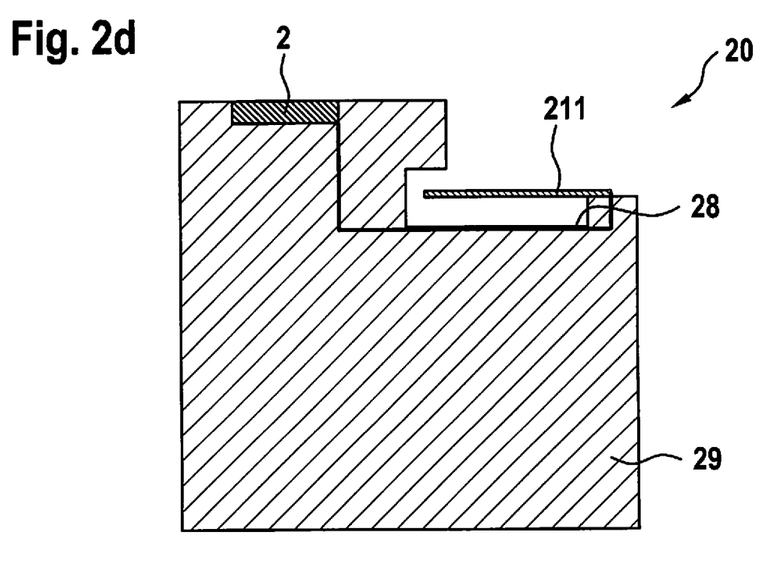
FIG. 2d shows a section through the structure of MEMS component 20 along section plane B.

In second exemplary embodiment 20 of a MEMS component according to the present invention as shown in FIGS. 2a through 2d, the component structure is also implemented in a layer structure on a semiconductor substrate. Sound-pressure-sensitive diaphragm structure 21 also includes four trapezoidal diaphragm elements 211, 212, 213, 214, which are each connected on one side to a centrally situated column element 23. This column element 23 also has a square cross section and each of diaphragm elements 211, 212, 213, 214 protrudes like a paddle from one side of column element 23. In contrast to MEMS component 10, however, the rear opening includes four partial openings 221, 222, 223, 224 here, which are separated from one another by webs 29. Each diaphragm element 211, 212, 213, 214 spans one of these partial openings 221, 222, 223, 224, so that it extends laterally beyond webs 29 and protrudes with its free end into a groove 25 in the outer edge region of corresponding partial opening 221, 222, 223, and 224, respectively. This is illustrated in particular by FIGS. 2a and 2c. The wall of this groove 25 forms a stop and overload protector for particular diaphragm elements 211, 212, 213, 214. FIG. 2d illustrates that webs 29 between partial openings 221, 222, 223, 224 are formed generally in the entire thickness of the layer structure.

In the case of MEMS component 20, the deflections of diaphragm elements 211, 212, 213, 214 are also detected with the aid of piezosensitive circuit elements, which are implemented in the layer structure of the diaphragm structure and are each situated in the area of the attachment to column element 23. FIG. 2d shows that the electrical connection of these circuit elements is carried out via strip conductors 28 on webs 29, which are led to terminal pads 2 on the component surface.

Figure 3A:
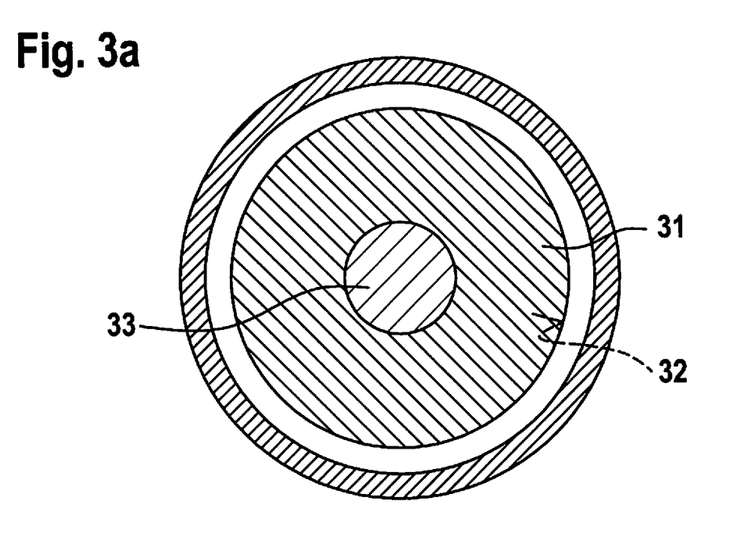
FIGS. 3a through 3c show three different diaphragm layouts 301, 302, and 303.
Figure 3B:
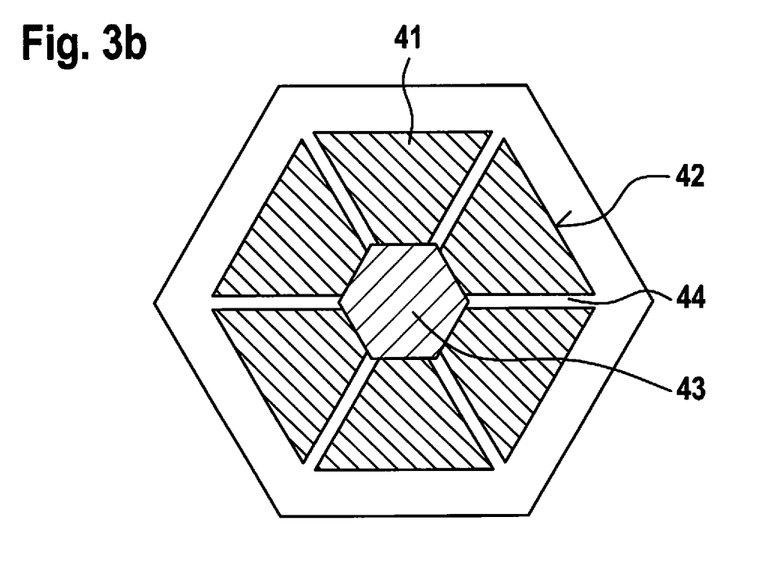
Figure 3C:
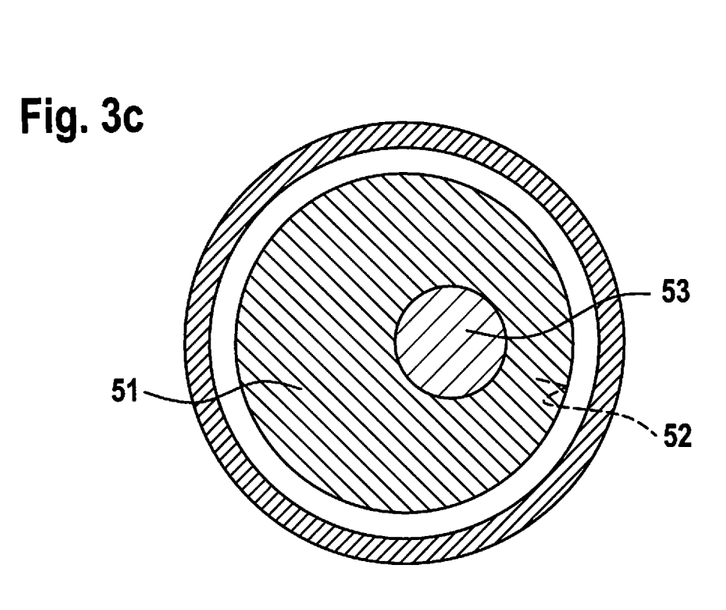

FIGS. 3a through 3c illustrate that very different diaphragm shapes may be implemented within the scope of the present invention, and the position of the central diaphragm suspension may also be varied.

Thus, FIG. 3a shows a circular closed diaphragm element 33, which is attached via a centrally situated cylindrical column element 33 to the component structure and spans a rear opening 32 having a circular opening area, the free outer edge of diaphragm element 33 overlapping the opening edge.

In the variant shown in FIG. 3b, an opening 42 having a hexagonal opening area is formed in the layer structure of the component. A column element 43 having a hexagonal cross section is situated centrally. A trapezoidal diaphragm element 41 is attached to each side of this column element 43, this diaphragm element extending like a paddle up to the opening edge, so that the six diaphragm elements 41 separated by slots 44 span the hexagonal opening area together.

The variant shown in FIG. 3c corresponds in the diaphragm shape and rear opening 52 to the specific embodiment shown in FIG. 3a. In contrast thereto, however, central column element 53 is situated eccentrically here. The mechanical stresses in individual areas of circular closed diaphragm element 51 may thus be increased further at a given sound pressure load. This is because the asymmetrical arrangement of column element 53 as a diaphragm suspension/attachment produces an asymmetry in the modes of the diaphragm structure. Since the pressure-related deformation of the diaphragm structure corresponds to the shape of the first eigenmode, the component may be optimized with regard to sensitivity, bandwidth, and input capacitance of the analysis ASIC by way of a suitable combination of size and position of the attachment area, i.e., column element 53.

Figure 4A:
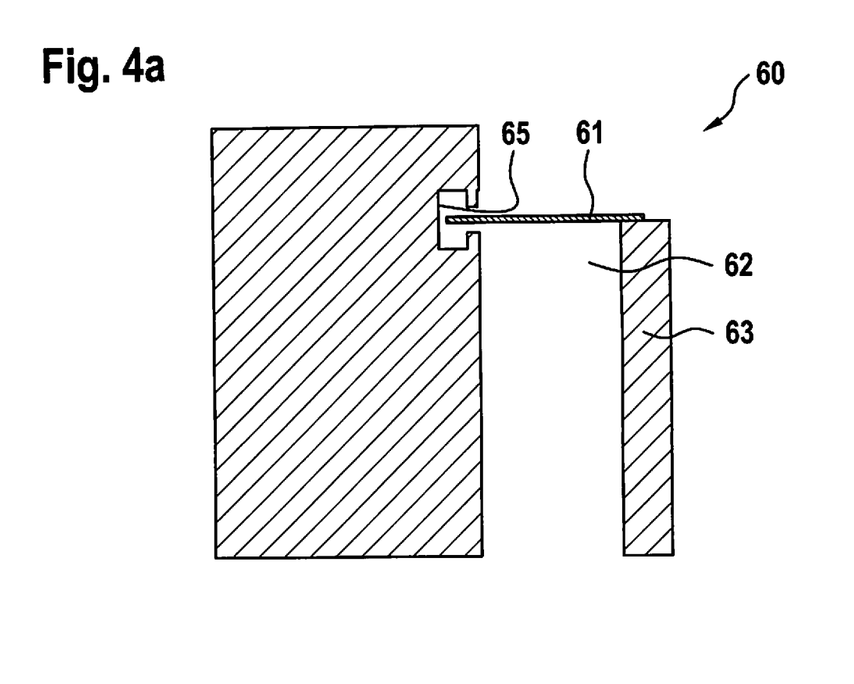
FIGS. 4a through 4c illustrate three different embodiments of the outer diaphragm edge on the basis of schematic sectional views.
Figure 4B:
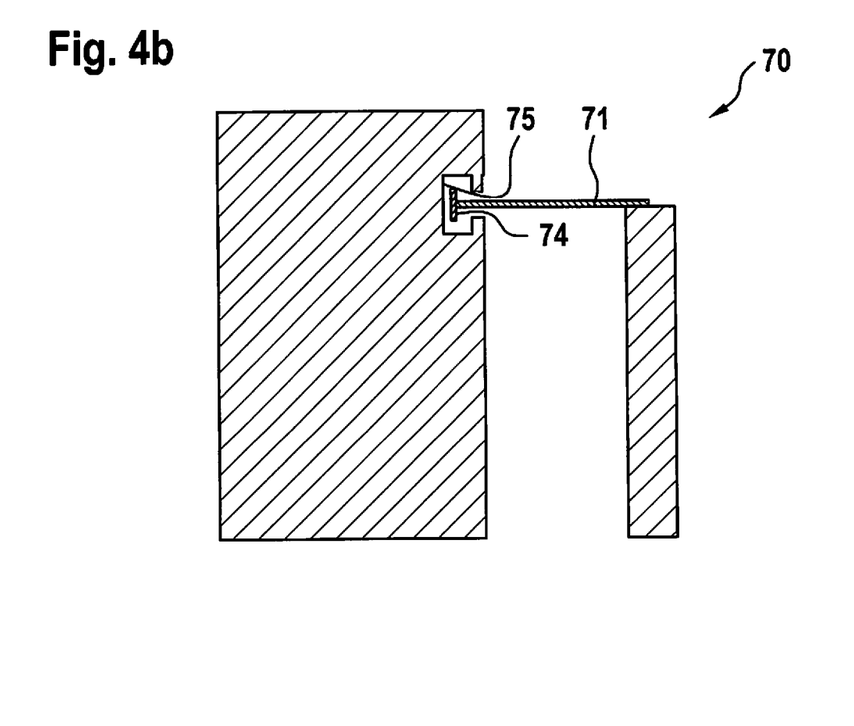
Figure 4C:
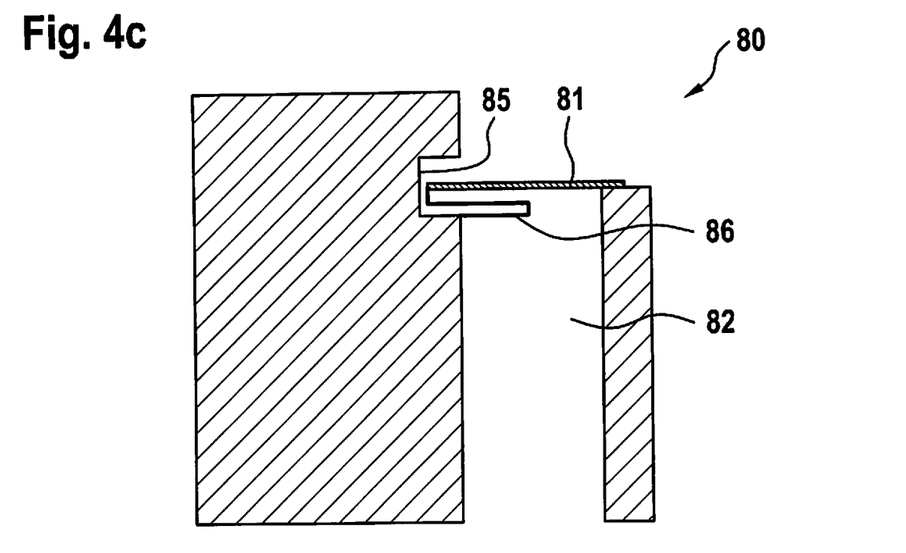

FIGS. 4a through 4c illustrate different specific embodiments of an overload protector for the diaphragm element of a MEMS component according to the present invention and measures for intentionally influencing the acoustic loss resistance of the microphone structure.

In the case of MEMS component 60 shown in FIG. 4a, the free edge area of diaphragm element 61, which is anchored centrally on a column element 63, protrudes into a circumferential groove 65 in the wall of an opening 62 in the component rear side. Groove 65 has a T-shaped cross-sectional area and tapers on the side facing toward diaphragm element 61.

FIG. 4b shows a refinement of the specific embodiment shown in FIG. 4a. In contrast to the flat diaphragm edge of MEMS component 60, the diaphragm edge terminates in the case of MEMS component 70 with a web 74, which protrudes from both surfaces of diaphragm element 71. The flow path inside groove 75 between the two sides of diaphragm element 71 is lengthened by this web 74, whereby the acoustic loss resistance of the microphone structure is increased.

The acoustic loss resistance is particularly large in the case of MEMS component 80 shown in FIG. 4c. The outer edge of centrally anchored diaphragm element 81 also protrudes here into a circumferential groove 85 in the wall of rear opening 82. In addition, it is connected via a more or less closed spring structure 86 to the opening wall. This spring structure 86 is designed in such a way that it does not obstruct the deflections of diaphragm element 81 at a normal sound pressure load, but prevents damage to diaphragm element 81 in overload situations. The acoustic loss resistance may be intentionally influenced here by the number, arrangement, and size of passage openings in spring structure 86.

Finally, it is also to be noted in conjunction with FIGS. 4a through 4c that specific embodiments of the present invention are also possible in which only partial areas of the diaphragm edge protrude into a groove in the opening wall and/or are attached via a spring structure to the opening wall.

What is claimed is:

1. A MEMS component, comprising:
   a layer structure;
   at least one sound-pressure-sensitive diaphragm element formed in the layer structure, the at least one sound-pressure-sensitive diaphragm element spanning an opening in the layer structure and being attached to the layer structure of the MEMS component via at least one column element in a central area of the opening;
   at least one piezosensitive circuit element to detect deflections of the at least one sound-pressure-sensitive diaphragm element, the at least one piezosensitive circuit element implemented in the layer structure of the at least one sound-pressure-sensitive diaphragm element and being situated in an area of the attachment of the at least one sound-pressure-sensitive diaphragm element to the column element,
   wherein the at least one sound-pressure-sensitive diaphragm element includes multiple paddle-like diaphragm elements, which are each connected at one end to the column element and extend therefrom at least up to the edge of the opening in the layer structure.

2. The MEMS component as recited in claim 1, wherein the column element is situated essentially at least one of centrally or eccentrically in the opening and with respect to an area of the at least one sound-pressure-sensitive diaphragm element.

3. The MEMS component as recited in claim 1, wherein the at least one sound-pressure-sensitive diaphragm element extends on all sides at least up to an edge of the opening in the layer structure.

4. The MEMS component as recited in claim 1, wherein the opening includes multiple partial openings, which are each spanned by one paddle-like diaphragm element.

5. The MEMS component as recited in claim 1, wherein a circumferential gap is between the at least one sound-pressure-sensitive diaphragm element and an edge of the opening in the layer structure.

6. The MEMS component as recited in claim 1, further comprising:
 an overload protector for the at least one sound-pressure-sensitive diaphragm element in an edge area of the opening, the overload protector interacting with an outer edge of the at least one sound-pressure-sensitive diaphragm element.

7. The MEMS component as recited in claim 6, wherein a groove, into which the outer edge of the at least one sound-pressure-sensitive diaphragm element protrudes, is at an edge area of the opening.

8. The MEMS component as recited in claim 6, wherein the outer edge of the at least one sound-pressure-sensitive diaphragm element is connected via a spring structure to a wall of the opening.

9. The MEMS component as recited in claim 1, wherein electrical contacting of the piezosensitive circuit element takes place using at least one via in the column element.

\* \* \* \* \*